(12) United States Patent
Lee

(10) Patent No.: US 6,768,374 B1
(45) Date of Patent: Jul. 27, 2004

(54) PROGRAMMABLE GAIN AMPLIFIER WITH SINGLE STAGE SWITCHED CAPACITOR CIRCUIT USING BANDWIDTH BALANCING

(75) Inventor: Bumha Lee, Mountain View, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 0 days.

(21) Appl. No.: 10/397,122

(22) Filed: Mar. 25, 2003

Related U.S. Application Data

(63) Continuation-in-part of application No. 10/262,615, filed on Oct. 3, 2002, now Pat. No. 6,661,283.

(51) Int. Cl.[7] .............................. H03F 1/02; H03K 17/00
(52) U.S. Cl. .............................. 330/9; 330/51; 330/109; 327/124
(58) Field of Search ................................ 330/9, 51, 69, 330/107, 109, 258; 327/124

(56) References Cited

U.S. PATENT DOCUMENTS

| | | | |
|---|---|---|---|
| 4,849,707 A | 7/1989 | Nicollini ........................ 330/9 |
| 5,410,270 A | 4/1995 | Rybicki et al. ................. 330/9 |
| 5,689,201 A | * 11/1997 | Temes et al. ................. 327/95 |
| 5,805,019 A | 9/1998 | Shin ............................. 330/9 |
| 5,812,023 A | * 9/1998 | Jones ........................... 330/9 |
| 6,037,836 A | * 3/2000 | Yoshizawa ..................... 330/9 |
| 6,169,427 B1 | 1/2001 | Brandt ........................ 327/94 |
| 6,169,727 B1 | 1/2001 | Song ............................ 327/94 |

* cited by examiner

Primary Examiner—Khanh Van Nguyen
(74) Attorney, Agent, or Firm—Mark R. Hennings; Merchant & Gould

(57) ABSTRACT

A single stage switched capacitor programmable gain amplifier uses programmable capacitor values to adjust gain factors. The operation of the amplifier is described by a transfer function having two gain factors: (C1/C2) and (C2/C3). The gain factor of C1/C2 applies during the holding phase and the gain factor of C2/C3 applies during the sampling phase. The transfer function is equal to the product of the two gain factors: (C1/C2)×(C2/C3) such that the transfer function is equal to (C1/C3). The intermediate element C2 can be adjusted to maximize bandwidth because C2 is independent of the total transfer gain. Accordingly, the intermediate element C2 is substantially fixed from the holding phase to the following sampling phase such that the bandwidth of the programmable gain amplifier is maximized in the two phases.

20 Claims, 5 Drawing Sheets

PROGRAMMABLE GAIN AMPLIFIER WITH SINGLE STAGE SWITCHED CAPACITOR CIRCUIT USING BANDWIDTH BALANCING

RELATED APPLICATIONS

This utility patent application is a continuation-in-part of U.S. patent application Ser. No. 10/262,615, filed Oct. 3, 2002, now U.S. Pat. No. 6,661,283, of which the benefit of the earlier filing date is hereby claimed under 35 U.S.C. §120.

FIELD OF THE INVENTION

The present invention relates generally to programmable gain amplifiers, and more particularly to switched capacitor circuit amplifiers.

BACKGROUND OF THE INVENTION

Advances in analog signal processing require programmable gain amplifiers that are capable of amplifying a wide dynamic range of analog input signals. Additionally, such amplifiers are required to finely control the amount of the gain that is applied to an analog input signal. As target resolutions and operating speeds increase, power dissipation also undesirably increases. Multiple stage programmable gain amplifiers are used to achieve wide dynamic ranges. However, operational amplifiers consume a disproportionate amount of power.

A more complete appreciation of the present invention and its improvements can be obtained by reference to the accompanying drawings, which are briefly summarized below, to the following detailed description of illustrated embodiments of the invention, and to the appended claims.

DETAILED DESCRIPTION OF THE PREFERRED EMBODIMENTS

Figure 1:
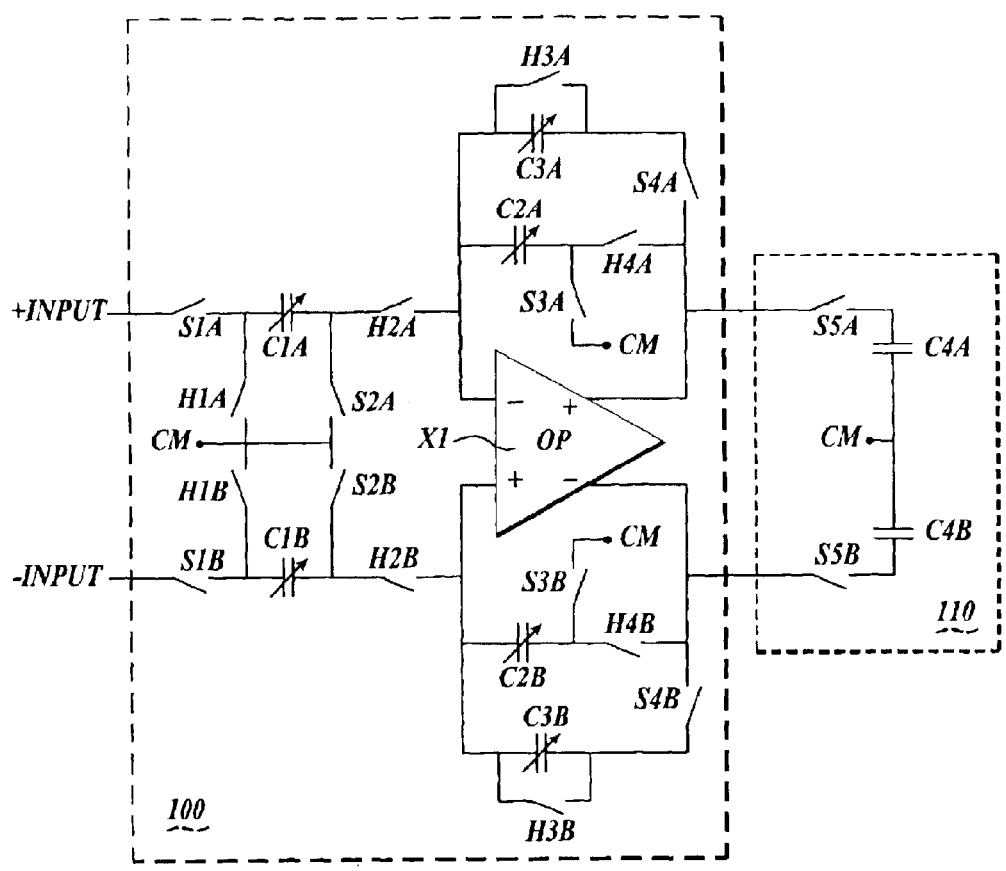
FIG. 1 is a schematic of an example single stage switched capacitor programmable gain amplifier in accordance with the present invention.

In the following detailed description of exemplary embodiments of the invention, reference is made to the accompanied drawings, which form a part hereof, and which is shown by way of illustration, specific exemplary embodiments of which the invention may be practiced. These embodiments are described in sufficient detail to enable those skilled in the art to practice the invention, and it is to be understood that other embodiments may be utilized, and other changes may be made, without departing from the spirit or scope of the present invention. The following detailed description is, therefore, not to be taken in a limiting sense, and the scope of the present invention is defined only by the appended claims.

Throughout the specification and claims, the following terms take the meanings explicitly associated herein, unless the context clearly dictates otherwise. The meaning of "a," "an," and "the" includes plural reference, the meaning of "in" includes "in" and "on." The term "connected" means a direct electrical connection between the items connected, without any intermediate devices. The term "coupled" means either a direct electrical connection between the items connected, or an indirect connection through one or more passive or active intermediary devices. The term "circuit" means either a single component or a multiplicity of components, either active and/or passive, that are coupled together to provide a desired function. The term "signal" means at least one current, voltage, or data signal. Referring to the drawings, like numbers indicate like parts throughout the views.

The present invention is directed towards a single stage switched capacitor programmable gain amplifier. The operation of the amplifier is described by a transfer function having two gain factors: (C1/C2) and (C2/C3). The gain factor of C1/C2 applies during the holding phase and the gain factor of C2/C3 applies during the sampling phase. The transfer function is equal to the product of the two gain factors: (C1/C2)×(C2/C3) such that the transfer function is equal to (C1/C3). The intermediate element C2 can be adjusted to maximize bandwidth because C2 is independent of the total transfer gain. Accordingly, the intermediate element C2 is substantially fixed from the holding phase to the following sampling phase such that the bandwidth of the programmable gain amplifier is maximized in the two phases.

FIG. 1 is a schematic of an example single stage switched capacitor programmable gain amplifier in accordance with the present invention. Programmable gain amplifier (PGA) 100 includes capacitors C1A, C1B, C2A, C2B, C3A and C3B, switching circuits S1A, S1B, S2A, S2B, S3A, S3B, H1A, H1B, H2A, H2B, H3A, H3B, H4A, H4B, S4A, and S4B, and amplifier X1. Amplifier X1 is typically a high performance amplifier such as a folded cascode amplifier, or a higher gain amplifier (such as a gain boosted folded cascode amplifier) can be used for even higher performance. Example input circuit 110 shows an input equivalent circuit connected to the output of PGA 100. Circuit 110 comprises switching circuits S5A and S5B, and capacitors C4A and C4B.

PGA 100 is a differential amplifier having a differential input signal, which reduces noise by providing common mode noise rejection. Each half of the differential input signal is processed by the "positive input side" (side "A") or the "negative input side" of PGA 100 (side "B"). Node CM is a common mode voltage, which is typically selected to be about half of the supply voltage. For simplicity, discussion related to the positive input side also applies to the negative input side unless the context clearly indicates otherwise. Also for simplicity, switching circuits designated with an initial "S" are assumed in the discussion to be closed during the sampling phase and open during the holding phase. Likewise, switching circuits designated with an initial "H" are assumed the discussion to be open during the sampling phase and closed during the holding phase.

Briefly stated, PGA 100 uses adjustable capacitors to determine to gain factors for the operational amplifier. A first gain factor is realized during the holding phase and is determined by capacitors C1A and C2A. The second gain factor is realized during the sample phase and is determined by capacitors C2A and C3A. Capacitors C1B and C2B are used to determine the first gain factor for side B of PGA 100. Likewise, capacitors C2B and C3B are used to determine the second gain factor for side B.

Capacitors C1A, C1B, C2A, C2B, C3A, and C3B are variable capacitors. Capacitors C1A, C1B, C2A, C2B, C3A, and C3B can be arranged as an array of capacitors within a switching matrix. The values for capacitors C1A, C1B, C2A, C2B, C3A, and C3B can be varied by selectively programming the switching matrix to activate conductive paths between certain capacitors within the array of capacitors.

The relative number of capacitors within the array can be kept relatively small because the gain factor (and sample step size) is determined by the (multiplicative) product of the values of the capacitors. Thus, a wide range of amplifier parameters can be achieved while only using a relatively small number of array capacitors.

A first programmable gain factor can be obtained by adjusting the size of capacitors C1A and C1B (during the holding phase). A second programmable gain factor can be obtained by adjusting the size of capacitors C3A and C3B (during the sampling phase). The intermediate element (i.e., capacitor C2A or C2B) does not directly determine the total transfer gain. However, a gain balancing technique may be used, in which the intermediate element is adjusted. The values of capacitors C2A and C2B can be adjusted according to the total transfer gain (C1/C3) and the transfer gain and loading conditions encountered during the fine and course amplification states.

The total transfer gain is determined by two different transfer functions. The first transfer function (which is dependent upon the term C1/C2) applies during the holding phase (in which switches H1 and H4 are closed). The second transfer function (which is dependent upon the term C2/C3) applies during the sampling phase (in which switches S3 and S4 are closed). As described briefly above, the total transfer function may be given as: (C1/C2)×(C2/C3)=(C1/C3). Thus the value of the intermediate element C2 can be adjusted without affecting the total transfer gain.

The gain bandwidth of −3 dB during the holding phase may be described as:

$$\omega_{-3dB} = \frac{gm}{C2\|(C1+C_p)+C_{CMFB}} \times \frac{C2}{C1+C2+C_p} \quad (I)$$

where gm is the transconductance of the amplifier input pair, $C_p$ is the parasitic capacitance at the amplifier input node, $C_{CMFB}$ is the value of the capacitor that provides common mode feedback. The term $$\frac{gm}{C2\|(C1+C_p)+C_{CMFB}}$$

signifies the unity gain bandwidth and the term $$\frac{C2}{C1+C2+C_p}$$

represents the feedback factor.

The gain bandwidth of −3 dB during the sampling phase may be described as:

$$\omega_{-3dB} = \frac{gm}{C3\|(C2+C_p)+C_{CMFB}+C4} \times \frac{C3}{C2+C3+C_p} \quad (II)$$

where the term $$\frac{gm}{C3\|(C2+C_p)+C_{CMFB}+C4}$$

signifies the unity gain bandwidth and the term $$\frac{C3}{C2+C3+C_p}$$

represents the feedback factor.

The total transfer gain of amplifier 100 can be defined as the multiplicative product of the transfer gain of the holding phase and the transfer gain of the sampling phase. When the transfer gains of each phase are unequal (and assuming the capacitive loading during each phase is similar), unequal bias currents are produced during each phase to obtain the required bandwidth, which signifies that the bandwidth has not been optimized. Balancing the transfer gain of the sampling phase with the transfer gain of the holding phase can be used to optimize the bandwidth with the same amount of bias current.

Equations I and II demonstrate that the bandwidth during the holding and sampling phases can be optimized by adjusting the value of the intermediate element C2. For example, if a total transfer gain of 10 is desired, the transfer gain of the holding phase and the transfer gain of the sampling phase should both be 3.33. The transfer gain may be balanced by adjusting the value of the intermediate element C2. The bandwidth may be optimized in cases where the capacitive loading conditions vary between phases by adjusting the intermediate element in accordance with Equations I and II.

When the minimum transfer gain of PGA 100 is unity, the intermediate element should be adjusted such that both the holding phase transfer function and the sampling phase transfer function are greater than or equal to unity gain. If either of the holding phase or sampling phase transfer functions is less than unity gain, the analog output may undesirably exceed an acceptable output range during one phase and may be undesirably attenuated during the other phase.

During the sample phase, the positive side of an analog input signal is sampled by capacitor C1A in response to switching circuits S1A and S2A being closed. A charge on capacitor C2A (stored thereon during the previous holding period) is transferred to capacitor C3A in response to closing switching circuits S3A and S4A being closed. No charge is left in capacitor C2A after the transfer of charge. The charge on capacitor C3A is amplified by amplifier X1 (using a capacitive feedback path that is associated with capacitor C3A) in response to closing switching circuits S3A and S4A. Capacitor C4 (which is the input of a next stage or other switched capacitor device) is coupled to PGA 100 during the sampling phase. The operation of the sampling phase of PGA 100 is further described below with respect to FIG. 2.

During the holding phase, capacitor C3A is reset in response to switching circuit H3A being closed. Charge that is stored on capacitor C1A is transferred to capacitor C2A in response to closing switching circuits H1A, H2A. The charge on capacitor C2A and is amplified by amplifier X1 in response to switching circuit H4A being closed. Capacitor C4 (which is the input of a next stage or other switched capacitor device) is not coupled to PGA 100 during the holding phase. The operation of the sampling phase of PGA 100 is further described below with respect to FIG. 3.

Figure 2:
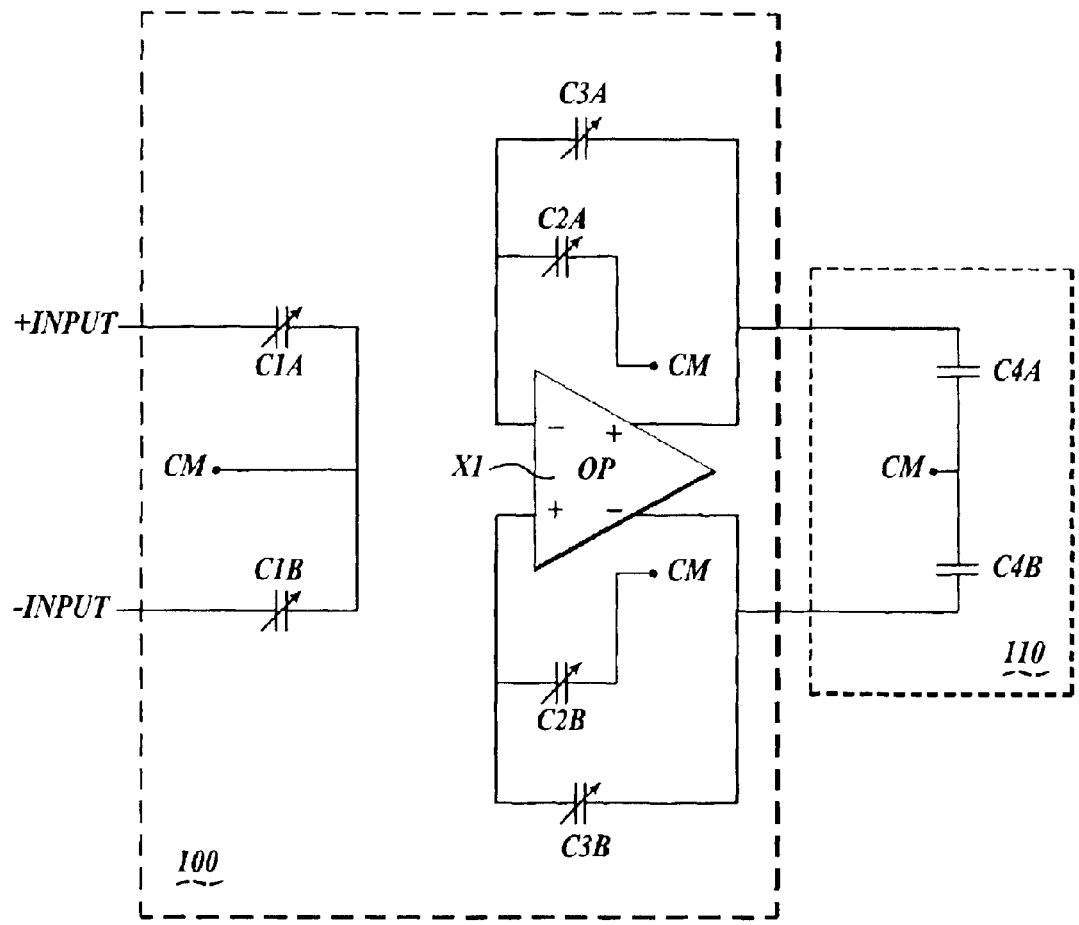
FIG. 2 is a schematic of an example single stage switched capacitor programmable gain amplifier during a sampling phase in accordance with the present invention.

FIG. 2 is a schematic of an example single stage switched capacitor PGA during a sampling phase in accordance with the present invention. During the sampling phase, the input signal is sampled on C1A and C1B. The amplified outputs of the previous holding phase (that have been amplified with ratio of C1/C2) are amplified by amplifier X1 (using a capacitive feedback path that is associated with capacitor C3A) according to the ratio of C2/C3. When the amplification is complete, the outputs can be sampled by sampling capacitors C4A and C4B of the next stage (or other switched capacitor device). Capacitors C2A and C2B are discharged in response to being coupled to node CM.

Figure 3:
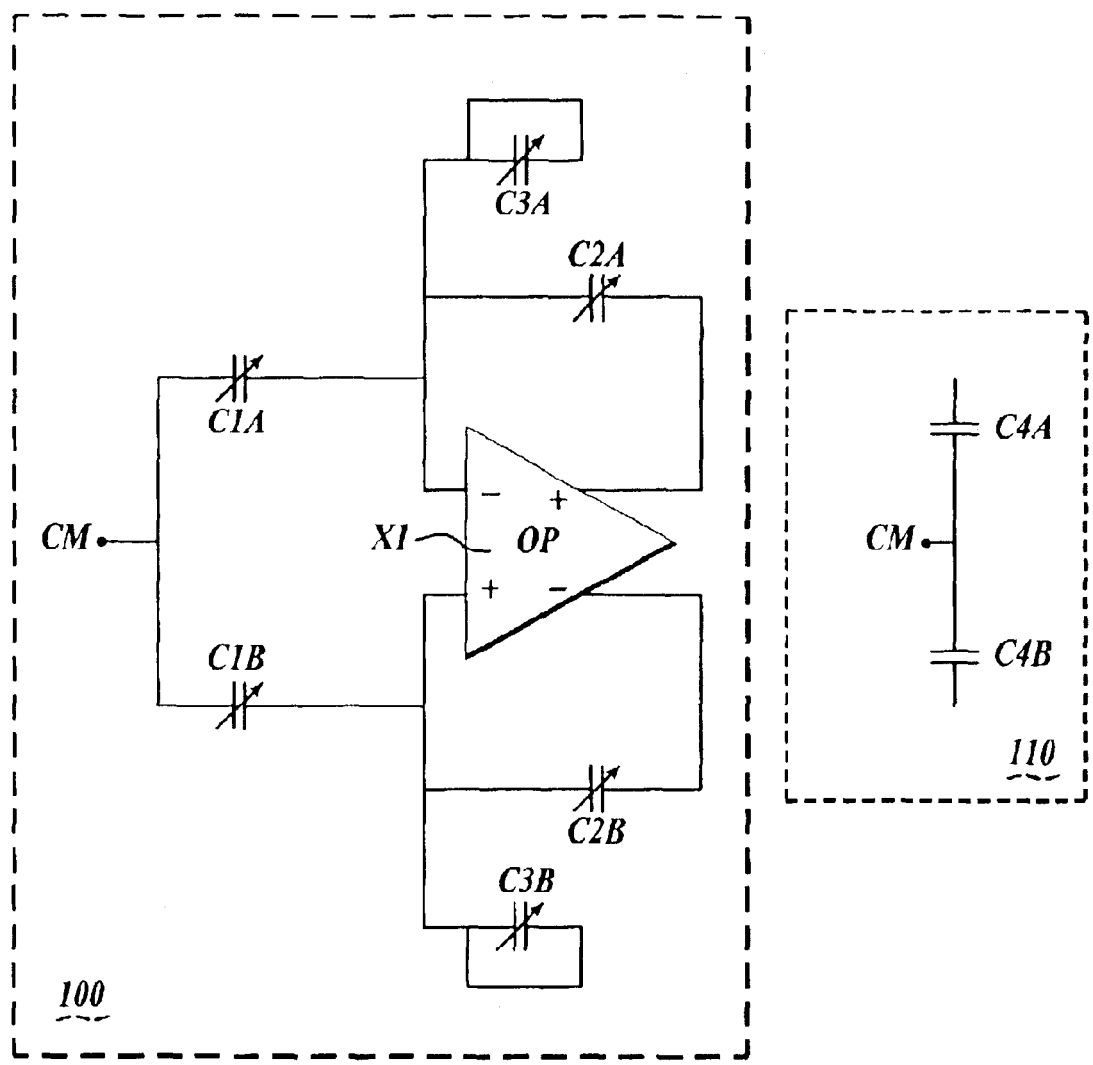
FIG. 3 is a schematic of an example single stage switched capacitor programmable gain amplifier during a holding phase in accordance with the present invention.

FIG. 3 is a schematic of an example single stage switched capacitor PGA during a holding phase in accordance with the present invention. During the holding phase, sampled charges that are stored on capacitors C1A and C1B are amplified and transferred to feedback capacitors C2A and C2B according to the ratio of C1/C2. The charges on C3A and C3B are discharged in response to being coupled to node CM.

Figure 4:
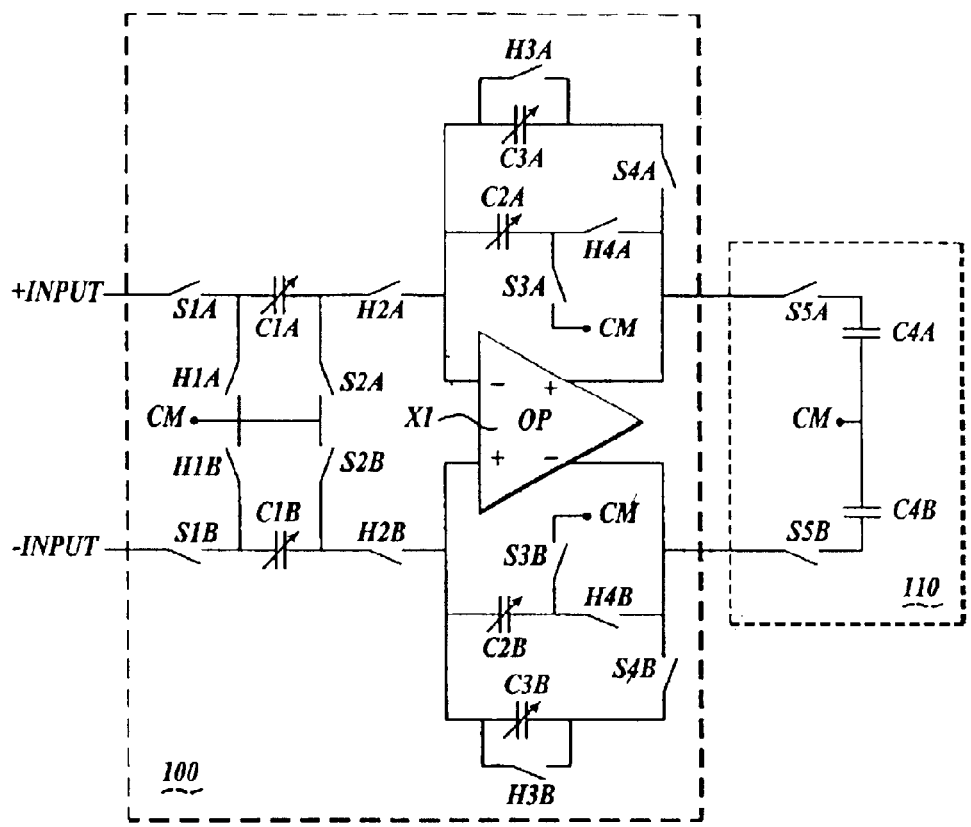
FIG. 4 is a timing diagram of signal flow in an example single stage switched capacitor programmable gain amplifier in accordance with the present invention.

FIG. 4 is a timing diagram of signal flow in an example single stage switched capacitor programmable gain amplifier in accordance with the present invention. The input signal is sampled on capacitors C1A and C1B during the sampling phase (when node $Q_S$ is high). The sampled input signal is amplified with ratio of C1/C2 during the holding phase (when node $Q_H$ is high) and stored on capacitors C2A and C2B. During the next sampling phase, the input signal is again sampled on capacitors C1A and C1B (not shown). Also during the next sampling phase, the amplified signals (which are stored on capacitors C2A and C2B) are amplified again according to the ratio of C2/C3. The charge stored by capacitors C2A and C2B is completely transferred to C3A and C3B respectively, such that no resetting is required to remove any residual charge on capacitor C2A and C2B. At the end of the sampling period, the output signal can be sampled by the sampling capacitor of a next stage (or other switched capacitor device).

Figure 5:
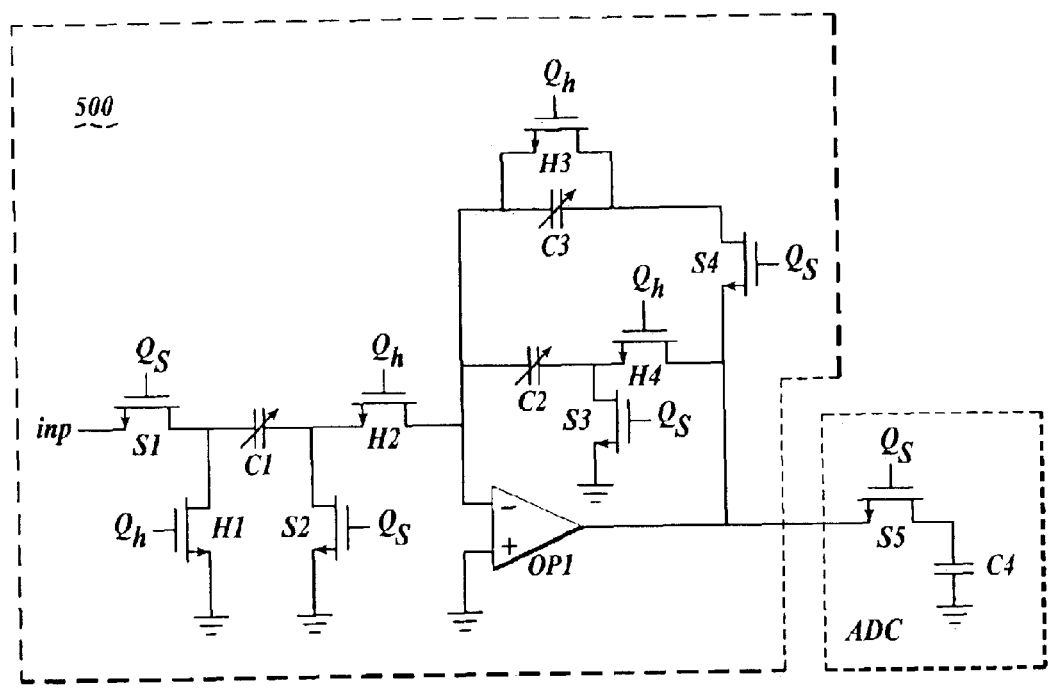
FIG. 5 is a schematic of an example single-ended single stage switched capacitor programmable gain amplifier in accordance with the present invention.

FIG. 5 is a schematic of an example single-ended single stage switched capacitor PGA in accordance with the present invention. PGA 500 is a single-ended embodiment of the present invention. Switching circuits S1–S5 and H1–H4 are implemented as CMOS transistors. Switching circuits S1–S5 and H1–H4 operate in similar fashion as discussed above to switching circuits S1A–S5A and H1A–H4A, respectively. Switching circuits S1–S5 are closed during the sampling phase and are open during the holding phase. Switching circuits H1A–H4A are open during the sampling phase and are closed during the holding phase. The input signal is referenced to a ground voltage reference (as compared with a common mode reference used in PGA 100). The analog signal flow of PGA 500 is similar the analog signal flow shown in FIG. 4, except that the differential signals are single-ended.

Other embodiments of the invention are possible without departing from the spirit and scope of the invention. The above specification, examples and data provide a complete description of the manufacture and use of the composition of the invention. Since many embodiments of the invention can be made without departing from the spirit and scope of the invention, the invention resides in the claims hereinafter appended.

I claim:

1. A switched capacitor programmable amplifier circuit, comprising:

a first capacitor that is configured to store a sampled charge that is associated with an input signal during a sampling phase and transfer the sampled charge during a holding phase;

a second capacitor that is configured to have a substantially fixed value from the holding phase to a sampling phase and that is further configured to discharge during the sampling phase and provide a first capacitive feedback path such that a first amplified charge is stored on the second capacitor during the holding phase;

a third capacitor that is configured to provide a second capacitive feedback path during the sampling phase and discharge during the holding phase; and an amplifier that is configured to amplify the transferred sampled charge using the first capacitive feedback path to produce the first amplified charge during the holding phase and amplify the stored first amplified charge using the second capacitive feedback path to produce a second amplified charge during the sampling phase.

2. The circuit of claim 1, wherein the amplifier is further configured to transfer the sampled charge according to a first ratio that is determined by the capacitance of the first capacitor divided by the capacitance of the second capacitor.

3. The circuit of claim 2, wherein the amplifier is further configured to amplify the stored first amplified charge according to a second ratio that is determined by the capacitance of the second capacitor divided by the capacitance of the third capacitor.

4. The circuit of claim 3, wherein the first and third capacitors are configured to be adjusted such that an effective bandwidth of the amplifier using the first ratio is substantially equal to an effective bandwidth of the amplifier using the second ratio.

5. The circuit of claim 1, wherein the third capacitor is further configured to transfer charge to a switched capacitor circuit.

6. The circuit of claim 1, wherein the first and the third capacitors are variable capacitors.

7. The circuit of claim 6, wherein the amplifier is configured to have substantially the same bandwidth throughout both the holding and sampling phases.

8. A circuit for amplifying a signal, comprising:

means for storing a sampled charge that is associated with an input signal during a sampling phase on a first capacitor;

means for transferring the sampled charge from the first capacitor during the holding phase;

means for providing a first capacitive feedback path through which a first amplified charge is stored on a second capacitor during the holding phase;

means for adjusting the value of the second capacitor to optimize the bandwidth of an amplifier during the sampling and holding phases;

means for providing a second capacitive feedback path during the sampling phase;

means for amplifying the transferred sampled charge using the first capacitive feedback path to produce the first amplified charge during the holding phase; and means for amplifying the stored first amplified charge using the second capacitive feedback path to produce a second amplified charge during the sampling phase.

9. The circuit of claim 8, wherein the means for transferring the sampled charge transfers the sampled charge according to a ratio that is determined by the capacitance of the first capacitor divided by the capacitance of the second capacitor.

10. The circuit of claim 8, wherein the means for amplifying the stored first amplified charge amplifies the stored first amplified charge according to a ratio that is determined by the capacitance of the second capacitor divided by the capacitance of the third capacitor.

11. The circuit of claim 8, wherein the means for amplifying the transferred sampled charge amplifies the transferred sampled charge according to a ratio that is determined by the capacitance of the first capacitor divided by the capacitance of the third capacitor.

12. The circuit of claim 8, further comprising means for selecting the values of the first and third capacitors.

13. A method for amplifying a signal, comprising:

storing a sampled charge that is associated with an input signal during a sampling phase on a first capacitor;

transferring the sampled charge from the first capacitor during the holding phase;

providing a first capacitive feedback path through which a first amplified charge is stored on a second capacitor during the holding phase;

adjusting the value of the second capacitor to optimize the bandwidth of an amplifier during the sampling and holding phases;

providing a second capacitive feedback path during the sampling phase;

amplifying the transferred sampled charge using the first capacitive feedback path to produce the first amplified charge during the holding phase; and amplifying the stored first amplified charge using the second capacitive feedback path to produce a second amplified charge during the sampling phase.

14. The method of claim 13, wherein the sampled charge is transferred according to a ratio that is determined by the capacitance of the first capacitor divided by the capacitance of the second capacitor.

15. The method of claim 13, wherein the stored first amplified charge is amplified according to a ratio that is determined by the capacitance of the second capacitor divided by the capacitance of the third capacitor.

16. The method of claim 13, wherein the transferred sampled charge is amplified according to a ratio that is determined by the capacitance of the first capacitor divided by the capacitance of the third capacitor.

17. The method of claim 13, further comprising transferring charge from the third capacitor to a switched capacitor circuit.

18. The method of claim 13, further comprising selecting the values of the first and third capacitors.

19. The method of claim 13, wherein the value of the second capacitor is adjusted in the holding phase according to the formula:

$$\omega_{-3dB} = \frac{gm}{C2\|(C1+C_p)+C_{CMFB}} \times \frac{C2}{C1+C2+C_p}.$$

20. The method of claim 13, wherein the value of the second capacitor is adjusted in the sampling phase according to the formula:

$$\omega_{-3dB} = \frac{gm}{C3\|(C2+C_p)+C_{CMFB}+C4} \times \frac{C3}{C2+C3+C_p}.$$

* * * * *